United States Patent
Lowrey

(10) Patent No.: US 7,364,937 B2
(45) Date of Patent: Apr. 29, 2008

(54) VERTICAL ELEVATED PORE PHASE CHANGE MEMORY

(75) Inventor: Tyler Lowrey, San Jose, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 149 days.

(21) Appl. No.: 11/270,909

(22) Filed: Nov. 10, 2005

(65) Prior Publication Data
US 2006/0054878 A1 Mar. 16, 2006

Related U.S. Application Data

(62) Division of application No. 10/319,179, filed on Dec. 13, 2002, now Pat. No. 7,049,623.

(51) Int. Cl.
*H01L 21/00* (2006.01)

(52) U.S. Cl. ................ 438/95; 438/102; 257/E21.068; 257/E21.069

(58) Field of Classification Search .................. 438/95, 438/98, 102, 238, 257, 381
See application file for complete search history.

(56) References Cited

U.S. PATENT DOCUMENTS

| 5,534,711 | A | * | 7/1996 | Ovshinsky et al. | ............ 257/3 |
| 5,789,758 | A | * | 8/1998 | Reinberg | ........................ 257/3 |
| 5,920,788 | A | * | 7/1999 | Reinberg | .................... 438/466 |
| 6,507,061 | B1 | * | 1/2003 | Hudgens et al. | ............ 257/295 |
| 6,545,287 | B2 | * | 4/2003 | Chiang | ........................ 257/3 |
| 6,566,700 | B2 | * | 5/2003 | Xu | ............................ 257/296 |
| 6,586,761 | B2 | * | 7/2003 | Lowrey | ........................ 257/3 |
| 6,791,102 | B2 | * | 9/2004 | Johnson et al. | ................ 257/3 |

* cited by examiner

*Primary Examiner*—David Nhu
(74) *Attorney, Agent, or Firm*—Trop, Pruner & Hu, P.C.

(57) ABSTRACT

A vertical elevated pore structure for a phase change memory may include a pore with a lower electrode beneath the pore contacting the phase change material in the pore. The lower electrode may be made up of a higher resistivity lower electrode and a lower resistivity lower electrode underneath the higher resistivity lower electrode. As a result, more uniform heating of the phase change material may be achieved in some embodiments and better contact may be made in some cases.

10 Claims, 1 Drawing Sheet

VERTICAL ELEVATED PORE PHASE CHANGE MEMORY

CROSS-REFERENCE TO RELATED APPLICATIONS

This application is a divisional of U.S. patent application Ser. No. 10/319,179, filed on Dec. 13, 2002 now U.S. Pat. No. 7,049,623.

BACKGROUND

This invention relates generally to electronic memories and particularly to electronic memories that use phase change material.

Phase change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized. In some embodiments, however, thin-film chalcogenide alloy materials may be particularly suitable.

The phase change may be induced reversibly. Therefore, the memory may change from the amorphous to the crystalline state and may revert back to the amorphous state thereafter, or vice versa, in response to temperature changes. In effect, each memory cell may be thought of as a programmable resistor, which reversibly changes between higher and lower resistance states. The phase change may be induced by resistive heating.

Existing phase change memories may experience inefficient heating of the phase change material. Thus, there is a need for better ways to heat phase change material.

DETAILED DESCRIPTION

Figure 1:
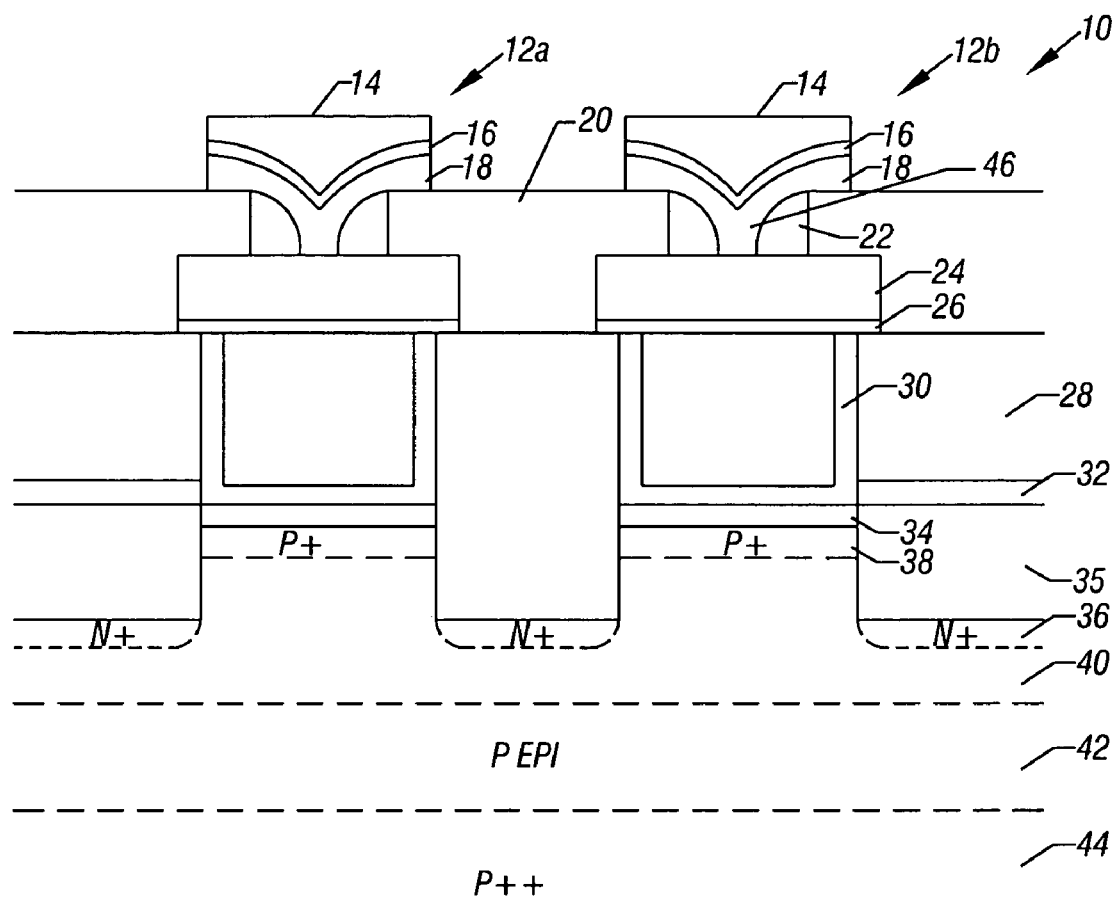
FIG. 1 is an enlarged cross-sectional view of a portion of a phase change memory in accordance with one embodiment of the present invention.

Referring to FIG. 1, a phase change memory 10 may include a plurality of phase change memory cells 12 including the adjacent cells 12a and 12b on adjacent bitlines 14. Each bitline 14 is positioned over a barrier material 16. The barrier material 16 may extend into a pore 46 on top of the phase change material 18 which may be a chalcogenide material in one embodiment of the present invention.

Examples of phase change memory material include, but are not limited to, chalcogenide element(s) compositions of the class of tellerium-germanium-antimony (Te$_x$Ge$_y$Sb$_z$) material or GeSbTe alloys, although the scope of the present invention is not limited to just these. Alternatively, another phase change material may be used whose electrical properties (e.g. resistance, capacitance, etc.) may be changed through the application of energy such as, for example, light, heat, or electrical current.

The pore 46 may be defined by a sidewall spacer 22 in one embodiment. The pore 46 and sidewall spacer 22 may be defined by an opening formed in a dielectric or insulating material 20. The material 20 may be an oxide, nitride, or any other insulating material.

Below the pore 46 is a pair of lower electrodes including a relatively higher resistivity lower electrode 24 and a relatively lower resistivity lower electrode 26. The higher resistivity electrode 24 may be responsible for heating the adjacent portion of the phase change material 46 and, thus, may have a greater vertical extent. The lower resistivity electrode matejial 26 functions to distribute electrical current efficiently across the entire width of the higher resistivity electrode material 24. The lower electrode 24 and the lower electrode 26 may have aligned edges as shown in FIG. 1.

Electrical current is received from the lower resistivity electrode material 26 and passes through the pedestal liner conductor 30 in one embodiment. The conductor 30 may be cup-shaped in one embodiment of the present invention and may be filled with an insulator 28 which also surrounds the pedestal liner conductor 30.

A nitride layer 32 may be penetrated by the pedestal liner conductor 30. The nitride layer 32 may be positioned over an isolating layer 35 formed on a semiconductor substrate including a p+ region 38.

The p+ region 38 may be adjacent a silicide contact region 34. Below the p+ region 38 is an n-type silicon layer 40. An n+ region 36 may be positioned between adjacent bitlines 14. Underneath the n-type silicon layer 40 is a p-type epitaxial (EPI) silicon layer 42 and a P++ type silicon substrate 44 in one embodiment of the present invention.

The resistivity of the relatively higher resistivity lower electrode 24 may be in the 1-500 mohm-cm, preferably 30-100 mohm-cm range. The lower resistivity lower electrode 26 may have a resistivity in the 0.01-1.0 mohm-cm, preferably 0.05-0.15 mohm-cm range in one embodiment of the present invention. Examples of resistive materials that may be used as the electrodes 24 and 26 include silicon nitride and tantalum nitride.

Figure 2:
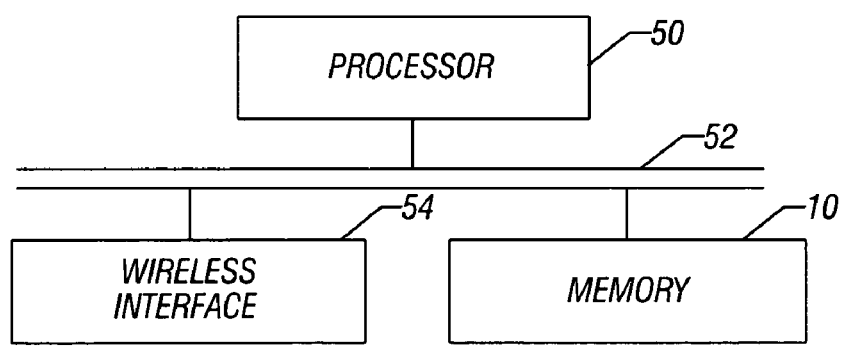
FIG. 2 is a schematic depiction of a system using a phase change memory in accordance with one embodiment of the present invention.

A processor-based system, shown in FIG. 2, may include a processor 50 such as a general purpose or digital signal processor as two examples. The processor 50 may be coupled to the memory 10, for example, by a bus 52. In some embodiments, a wireless interface 54 may be provided. The wireless interface 54 may include a transceiver or an antenna, to give two examples.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming a lower electrode having a stack including a first layer and a second layer, said second layer having higher resistivity than said first layer, said first and second layers having aligned edges; and forming a phase change material over said second layer.

2. The method of claim 1 including contacting said first layer with a conductor.

3. The method of claim 2 including forming an insulator over said lower electrode and forming a pore in said insulator.

4. The method of claim 3 including forming said phase change material in said pore in contact with said lower electrode.

5. The method of claim 4 including forming a lower electrode that is wider than said pore.

6. A method comprising:

forming a lower electrode having a first layer and a second layer, said second layer having higher resistivity than said first layer, said first layer being thinner than said second layer.

7. The method of claim 6 including contacting said first layer with a conductor.

8. The method of claim 6 including forming an insulator over said lower electrode and forming a pore in said insulator.

9. The method of claim 6 including forming a phase change material in a pore in contact with said lower electrode.

10. The method of claim 6 including forming a lower electrode that is wider than a pore.

* * * * *